United States Patent
Wich et al.

(10) Patent No.: US 10,819,383 B2
(45) Date of Patent: Oct. 27, 2020

(54) TRANSCEIVERS AND METHODS FOR OPERATING TRANSCEIVERS

(71) Applicant: Alcatel Lucent, Nozay (FR)

(72) Inventors: Andreas Wich, Stuttgart (DE); Dirk Wiegner, Stuttgart (DE)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 16/344,077

(22) PCT Filed: Oct. 24, 2017

(86) PCT No.: PCT/EP2017/077064
§ 371 (c)(1),
(2) Date: Apr. 23, 2019

(87) PCT Pub. No.: WO2018/077828
PCT Pub. Date: May 3, 2018

(65) Prior Publication Data
US 2020/0067559 A1    Feb. 27, 2020

(30) Foreign Application Priority Data
Oct. 27, 2016    (EP) .................................... 16306411

(51) Int. Cl.
*H04B 1/44*    (2006.01)
*H03F 3/19*    (2006.01)

(52) U.S. Cl.
CPC ............. *H04B 1/44* (2013.01); *H03F 3/19* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 5,590,412 A | * | 12/1996 | Sawai | H03F 3/1935 330/282 |
| 7,831,214 B1 | * | 11/2010 | Stockmann | G01S 7/034 455/78 |
| 7,877,063 B2 | * | 1/2011 | Kim | H03F 3/195 330/296 |
| 8,208,869 B2 | * | 6/2012 | Jeong | H03F 1/22 455/73 |
| 9,344,264 B2 | * | 5/2016 | Babitch | H04L 5/1461 |
| 2002/0098821 A1 | * | 7/2002 | Struhsaker | H04B 7/2615 455/305 |
| 2010/0309827 A1 | * | 12/2010 | Choi | H04B 1/403 370/280 |
| 2013/0294301 A1 | * | 11/2013 | Bitton | H04B 7/0691 370/297 |
| 2015/0244432 A1 | * | 8/2015 | Wang | H04B 7/0695 375/267 |

FOREIGN PATENT DOCUMENTS

EP    0 845 871 A2    6/1998

* cited by examiner

*Primary Examiner* — Tuan A Tran
(74) *Attorney, Agent, or Firm* — Harrington & Smith (57) ABSTRACT

A transceiver includes a transmit signal path, a receive signal path, an amplifier, and control circuitry. The control circuitry is configured to couple the amplifier in the transmit signal path to amplify a transmit signal during a transmit operating mode of the transceiver. Furthermore, the control circuitry is configured to couple the amplifier in the receive signal path to amplify a receive signal during a receive operating mode of the transceiver.

20 Claims, 5 Drawing Sheets

TRANSCEIVERS AND METHODS FOR OPERATING TRANSCEIVERS

CROSS REFERENCE TO RELATED APPLICATION

This patent application is a U.S. National Stage application of International Patent Application Number PCT/EP2017/077064 filed Oct. 24, 2017, which is hereby incorporated by reference in its entirety, and claims priority to EP 16306411.6 filed Oct. 27, 2016.

FIELD

Examples relate to transceivers and methods for operating transceivers. In particular, examples relate to operating amplifiers for amplifying transmit and receive signals in transceivers.

BACKGROUND

The increasing usage of mobile communication devices, such as smart phones, laptops, and tablet computers, combined with an increasing demand for higher data rates poses challenges on the electronic design of these devices. Often users of such devices ask for low power consumption in order to avoid having to frequently recharge their devices. Moreover, it is desired to shrink the size of mobile devices, to integrate more functionality into mobile devices and to manufacture them at low costs. Also in base stations, space and power requirements of telecommunication electronic circuits can be stringent, for example, in base stations having multiple transmit and receive channels and thus operating multiple transceivers.

US 2010/0309827 A1 describes a time division duplex transceiver sharing an electronic component, such as a power amplifier, during reception and transmission. Similarly, U.S. Pat. No. 5,590,412 discloses using a common amplifier for amplifying a received signal or a transmitted signal. An intermediate frequency amplifier using the same receive and transmit path is described in EP 0 845 871 A1.

There is a demand to provide an improved concept for transceivers featuring lower power consumption, smaller hardware complexity, and lower manufacturing costs.

SUMMARY

This demand is met by transceivers and methods in accordance with the independent claims.

According to a first aspect of the present disclosure, it is provided a transceiver. The transceiver comprises a transmit signal path, a receive signal path, an amplifier, and control circuitry. The control circuitry is configured to couple the amplifier in the transmit signal path to amplify a transmit signal during a transmit operating mode of the transceiver. Furthermore, the control circuitry is configured to couple the amplifier in the receive signal path to amplify a receive signal during a receive operating mode of the transceiver.

Some examples relate to a transceiver system. The transceiver system comprises a plurality of antennas and a plurality of transceivers. Each transceiver of the plurality of transceivers is coupled to at least one antenna of the plurality of antennas. Furthermore, each transceiver comprises a transmit signal path, a receive signal path, an amplifier, and control circuitry. The control circuitry of each transceiver is configured to couple the amplifier of each transceiver in the transmit signal path of each transceiver to amplify a transmit signal during a transmit operating mode of each transceiver. Furthermore, the control circuitry of each transceiver is configured to couple the amplifier of each transceiver in the receive signal path of each transceiver to amplify a receive signal during a receive operating mode of each transceiver.

According to another aspect of the present disclosure, it is provided a method for operating a transceiver. The method comprises coupling an amplifier in a receive signal path of the transceiver to amplify a receive signal during a receive operating mode of the transceiver. Furthermore, the method comprises coupling the amplifier in a transmit signal path of the transceiver to amplify a transmit signal during a transmit operating mode of the transceiver.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
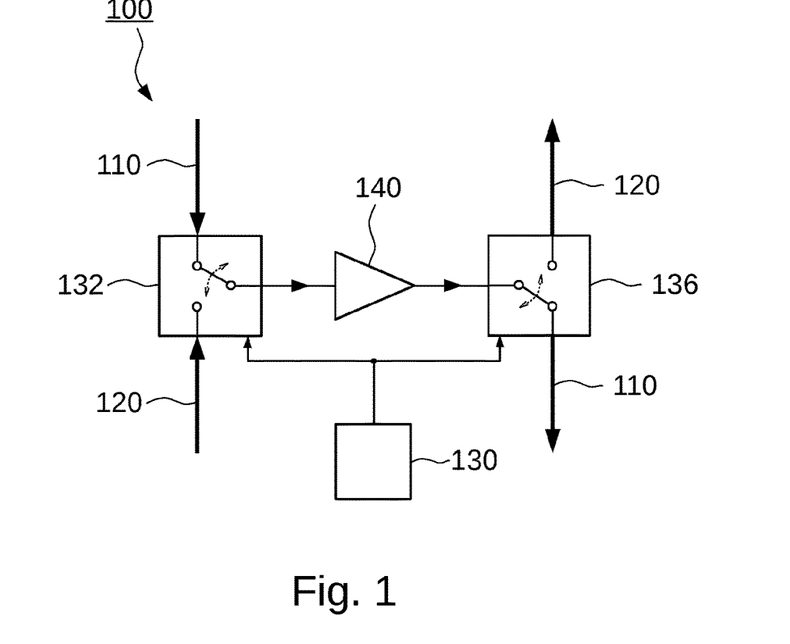
FIG. 1 shows a schematic block diagram of a part of a transceiver.

FIG. 1 shows a schematic block diagram of a part of a transceiver 100. The transceiver 100 comprises a transmit signal path 120 (e.g., transmit circuitry), a receive signal path 110 (e.g., receive circuitry), an amplifier 140, and control circuitry (e.g., switching circuitry and a controller circuit to actuate the switching circuitry). The control circuitry is configured to couple the amplifier 140 in the transmit signal path 120 to amplify a transmit signal during a transmit operating mode of the transceiver 100. Furthermore, the control circuitry is configured to couple the amplifier 140 in the receive signal path 110 to amplify a receive signal during a receive operating mode of the transceiver 100.

For example, the transceiver 100 can be operated according to time division duplexing (TDD). In time division duplexing the transceiver 100 may either transmit or receive at a time (e.g., may be either in the transmit operating mode or the receive operating mode). By coupling the amplifier 140 in the transmit signal path 120 during the transmit operating mode and by coupling the amplifier 140 in the receive signal path 110 during the receive operating mode, one and the same amplifier 140 can be employed for transmitting and receiving. In this way, the number of amplifiers of the transceiver 100 can be reduced. Sharing the amplifier 140 between the transmit signal path 120 and the receive signal path 110 can reduce the manufacturing costs of the transceiver 100, the overall size of the transceiver 100 (e.g., the space occupied by the transmit and the receive signal path 120, 110 on a circuit board or in an integrated circuit), and/or can reduce the power consumption of the transceiver 100 as less amplifiers may be supplied with electric power.

The transmit signal path 120 (e.g., the transmit circuitry) of the transceiver 100 can comprise an analog signal path and/or a mixed-signal signal path. For example, the transmit signal path 120 can comprise a digital-to-analog converter to provide an (analog) transmit signal at baseband, at an intermediate frequency, and/or at a radio frequency (e.g., a carrier frequency). The transmit signal path 120 can additionally comprise mixer circuitry, filter circuitry, additional amplifier circuitry (e.g., driver amplifiers and/or signal regeneration amplifiers), matching circuitry and/or a transmit output-port (e.g., an antenna, a jack, a plug, a waveguide port, and/or a radio frequency connector). For example, during the transmit operating mode the transmit signal propagates along the transmit signal path 120 from the digital-to-analog converter at least via the amplifier 140 to the transmit output-port.

The receive signal path 110 (e.g., the receive circuitry) of the transceiver 100 can comprise an analog signal path and/or a mixed-signal signal path. For example, the receive signal path 110 can comprise a receive input-port (e.g., an antenna, a jack, a plug, a waveguide port, and/or a radio frequency connector) to receive an (analog) receive signal. Moreover, the receive signal path 110 can additionally comprise mixer circuitry, filter circuitry, additional amplifier circuitry (e.g., driver amplifiers, and/or low noise amplifiers, etc.), and/or an analog-to-digital converter to sample the receive signal at baseband, at an intermediate frequency, and/or at a radio frequency (e.g., a carrier frequency). For example, during the receive operating mode the receive signal propagates along the receive signal path 110 from the receive input-port at least via the amplifier 140 to the analog-to-digital converter.

According to some examples (e.g., the exemplary transceiver 100 of FIG. 1), the control circuitry comprises a first switch 132 and a second switch 136. The amplifier 140 can be coupled between the first switch 132 and the second switch 136. For example, the first and the second switch 132, 136 can comprise transistor-switches, diode-switches, and/or electromechanical relays. For example, both the first switch 132 and the second switch 136 comprise a dedicated single-pole double-throw switch (SPDT-switch). Alternatively, the first switch 132 and the second switch 136 may be integrated into a common switch, e.g., a double-pole double-throw switch.

For example, a common terminal of the first switch 132 is coupled to an input-port of the amplifier 140, a first throw terminal of the first switch 132 is coupled to a receive input-port of the receive signal path 110, and a second throw terminal of the first switch 132 is coupled to a digital-to-analog converter of the transmit signal-path 120. Moreover, a common terminal of the second switch 136 can be coupled to an output-port of the amplifier 140, a first throw terminal of the second switch 136 can be coupled to an analog-to-digital converter of the receive signal-path 110, and a second throw terminal of the second switch 136 can be coupled to a transmit output-port of the transmit signal-path 120.

Additionally, the control circuitry of the transceiver 100 can comprise a controller circuit 130 to actuate the switching circuitry (e.g., the first and the second switch 132, 136). The controller circuit 130 can comprise at least a part of a micro-controller, at least a part of a central-processing-unit (CPU), and/or at least a part of a field programmable gate array (FPGA), for example.

During the receive operating mode, the controller circuit 130 can set the first switch 132 to electrically connect the common terminal and the first throw terminal of the first switch 132 and can set the second switch 136 to electrically connect the common terminal and the first throw terminal of the second switch 136. The receive signal can then propagate from the receive input-port via the first switch 132 to the amplifier 140, where it is amplified, and further via the second switch 136 to the analog-to-digital converter of the receive signal path 110, for example.

During the transmit operating mode, the controller circuit 130 can set the first switch 132 to electrically connect the common terminal and the second throw terminal of the first switch 132 and can set the second switch 136 to electrically connect the common terminal and the second throw terminal of the second switch 136. The transmit signal can then propagate from the digital-to-analog converter of the transmit signal path 120 via the first switch 132 to the amplifier 140, where it is amplified, and further via the second switch 136 to the transmit output-port, for example.

Additionally, the control circuitry (e.g., the controller circuit 130) can be configured to adjust a supply voltage of the amplifier 140 depending on an operating mode of the transceiver 100 (e.g., whether the transceiver 100 is in the receive operating mode or the transmit operating mode). This can reduce the average power consumption of the transceiver 100.

For example, the control circuitry (e.g., the controller circuit 130) can be configured to decrease a supply voltage of the amplifier 140 during the receive operating mode and to increase the supply voltage of the amplifier 140 during the transmit operating mode.

For instance, during the receive operating mode the desired (or required) maximum output power of the amplifier 140 may be lower (e.g., lower by more than 10 dB, or lower by more than 20 dB, or lower by more than 30 dB) than during the transmit operating mode, so that the amplifier 140 may operate at a lower supply voltage during the receive operating mode than during the transmit operating mode. During the receive operating mode the supply voltage of the amplifier 140 may be less than 80% (or less than 50%, or less than 30%) and/or more than 20% of the supply voltage of the amplifier 140 during the transmit operating mode. To this end, the controller circuit 130 may be configured for adjusting an output voltage of a switched voltage converter comprised by the transceiver 100 and used for the power supply of the amplifier 140.

In some embodiments (or in some applications of the transceiver 100), the control circuitry can also be configured to decrease the supply voltage of the amplifier 140 during the transmit operating mode and to increase the supply voltage during the receive operating mode. That is to say, during the transmit operating mode the supply voltage of the amplifier 140 may be lower than during the receive operating mode, for example, in case of a lower load during the transmit operating mode. In case of very weak receive signals, the control circuitry can be configured to increase the supply voltage of the amplifier 140 during the receive operating mode for sufficient amplification of the receive signals. A strength of a receive signal can be detected by an additional and optional power detector coupled in the receive signal path 110.

The control circuitry can be configured to couple the amplifier 140 as the first amplifier in the receive signal path to amplify the receive signal at a radio frequency during the receive operating mode. In other words, as the receive signal is received at the receive input-port and propagates along the receive signal path 110, the receive signal may be amplified for the first time at the amplifier 140 before reaching the analog-to-digital converter and/or before reaching a mixer that can convert the receive signal from the radio frequency to an intermediate frequency or to baseband.

For example, the control circuitry is configured to operate the amplifier 140 as a low noise amplifier (LNA) with a noise figure smaller than 5 dB (or smaller than 3 dB, or smaller than 1 dB, or smaller than 0.5 dB) at least during the receive operating mode. Such low noise figures may be achieved by various means. For example, the control circuitry can be configured to adapt an input matching network (and/or an output matching network) of the amplifier 140 in order to match the amplifier 140 rather for a low noise figure than for high power transfer. For adapting the input and/or the output matching network, the input and/or the output matching network may comprise adjustable elements (e.g., tunable and/or switchable capacitors, and/or tunable and/or switchable inductors) that can be controlled by the control circuitry.

Additionally, the control circuitry can be configured to decrease the supply voltage of the amplifier 140 during the receive operating mode, which can decrease the noise figure of the amplifier 140, because a lower supply voltage may also comprise lower noise. In addition, the control circuitry can be configured to filter the supply voltage (or bias voltage) of the amplifier, for example, by coupling a low pass filter in a supply voltage line of the amplifier 140 at least during the receive operating mode. Alternatively, the supply voltage line (or supply voltage lines) of the amplifier 140 may permanently comprise a low pass filter (or low pass filters) to filter the supply voltage from noise, which can decrease the noise figure of the amplifier 140. Additionally, the amplifier 140 may comprise electric elements that are inherently less noisy. For example, if the amplifier is used for amplifying receive signals at low frequencies (e.g., at frequencies lower than 1 GHz, or lower than 2 GHz, or lower than 3 GHz), an active element (e.g., a transistor or a plurality of transistors) of the amplifier 140 may be implemented by a bipolar device that is generally less noisy at low frequencies than a field-effect device (e.g., a metal-oxide-semiconductor field-effect transistor, MOSFET) due to inherently lower flicker noise in bipolar devices. This can further decrease the noise figure of the amplifier 140.

For example, during the transmit operating mode, the control circuitry is configured to couple the amplifier 140 as the last amplifier in the transmit signal path 120 to amplify the transmit signal at a radio frequency. In other words, after the (analog) transmit signal has been provided by the digital-to-analog converter of the transmit signal path 120 and/or after the transmit signal has been upconverted to a radio frequency, the transmit signal may be amplified for the last time by the amplifier 140 before reaching the transmit output-port of the transmit signal path 120.

For example, the control circuitry is configured to operate the amplifier 140 as a power amplifier (PA) with a power-added efficiency larger than 10% (or larger than 20%, or larger than 40%, or larger than 60%) at least during the transmit operating mode. For example, when the transceiver 100 is employed in a mobile telecommunication application, the control circuitry can be configured to operate the amplifier 140 as a power amplifier (PA). Such high power-added efficiencies may be achieved by various means. For example, the control circuitry can be configured to adapt the input matching network and/or the output matching network of the amplifier 140 in order to match the amplifier 140 rather for high power transfer than for a low noise figure during the transmit operating mode. Additionally, the control circuitry can be configured to adapt the input matching network and/or the output matching network of the amplifier 140 in order to provide defined terminations of harmonics generated by the amplifier 140. In this way, the control circuitry can be configured to operate the amplifier 140 as a class-F amplifier. Additionally, or alternatively, the control circuitry may be configured to adapt the bias point (e.g., the collector voltage and base voltage, or the drain voltage and gate voltage) of the amplifier 140 in order to operate the amplifier 140 as a class-c amplifier during the transmit operating mode, for example. Additionally, or alternatively, the control circuitry can be configured to monitor an envelope of the transmit signal and to continuously adjust the supply voltage of the amplifier 140 to operate the amplifier 140 at peak efficiency independently of an amplitude of the transceive signal. In other words, the control circuitry can be configured to operate as an envelope tracker for the amplifier 140.

In some examples, the transceiver 100 can further comprise an adjustable attenuator coupled between the first switch 132 and the second switch 136. The control circuitry can be configured to set the attenuation of the attenuator depending on an operating mode of the transceiver 100. The operating mode of the transceiver 100 can be the receive operating mode or the transmit operating mode. For example, during the transmit and the receive operating mode a different gain of the amplifier 140 may be desired. The amplifier 140 can then be designed that its gain matches the gain desired for the transmit or the receive operating mode whichever is higher. In the operating mode with the lower desired gain, the control circuitry may set the attenuation of the attenuator accordingly in order to decrease the overall gain of the amplifier 140 in combination with the adjustable attenuator.

Additionally, the amplifier 140 can comprise a first amplifier stage and a second amplifier stage. The adjustable attenuator can be coupled between the first and the second amplifier stage. With an additional amplifier stage (e.g., the second amplifier stage) the gain of the amplifier 140 may be increased, for example, if a higher gain is desired for one or both of the operating modes of the amplifier 140. The adjustable attenuator being coupled between the first and the second amplifier stage can prevent the second amplifier stage from being overdriven by the first amplifier stage.

Alternatively, the adjustable attenuator can be coupled to the input-port of the first amplifier stage (e.g., between the first switch 132 and the first amplifier stage) or can be coupled to the output-port of the second amplifier stage (e.g., between the second amplifier stage and the second switch 136).

According to an embodiment of the transceiver 100, a first adjustable attenuator can be coupled between the first amplifier stage and the second amplifier stage of the amplifier 140. A second adjustable attenuator can be coupled into the receive signal path 110 (and can be excluded from the transmit signal path 120). For example, the second adjustable attenuator can be coupled between the second switch 136 and a mixer (or an analog-to-digital converter) of the receive signal path 110. This way, the first adjustable attenuator can prevent the second amplifier stage from being overdriven and/or can compensate desired gain differences of the amplifier 140 for the transmit and the receive operating mode. The second adjustable attenuator can prevent the mixer (and/or the analog-to-digital converter) of the receive signal path 110 from being overdriven. Because in this example, the second adjustable attenuator is coupled to the output of the second amplifier stage, but is excluded from the transmit signal path 120, an insertion loss and/or a set attenuation of the second adjustable attenuator does not reduce the output power at the transmit output-port and/or the transmit efficiency of the transceiver 100 during the transmit operating mode.

According to some examples, the transceiver 100 further comprises a dual band filter. The dual band filter can be coupled between the first switch 132 and the second switch 136 of the transceiver 100. For example, the dual band filter may be coupled between the first switch 132 and the input-port of the amplifier 140 or between the output-port of the amplifier 140 and the second switch 136. Additionally, the amplifier 140 may comprise a first and a second amplifier stage. The dual band filter may then be coupled between the first and the second amplifier stage. The dual band filter can comprise a first passband covering the frequency band of receive signals of the transceiver 100 and a second passband covering the frequency band of transmit signals of the transceiver 100. By providing a dual band filter coupled between the first and the second switch 132, 136, the transceiver 100 can be configured to operate according to time division based, simplified frequency division duplexing. To this end, a bandwidth of the amplifier 140 may cover the frequency band of the transmit signals of the transceiver 100 and the frequency band of the receive signals of the transceiver 100.

In some examples, the receive input-port and the transmit output-port are comprised by a common transceive port. For example, the transceive port may comprise (or be) a transceive antenna. In this way, the numbers of antennas of the transceiver 100 can be reduced resulting in a reduced overall size of the transceiver 100.

According to some examples, an upconversion mixer is coupled between the digital-to-analog converter of the transmit signal path 120 and the second throw terminal of the first switch 132. In addition, a downconversion mixer can be coupled between the first throw terminal of the second switch 136 and the analog-to-digital converter of the receive signal path 110.

Some embodiments of this disclosure relate to transceivers of a mobile communication system. The transceiver 100 may be employed in a radio access node of a mobile communication system. For example, some embodiments relate to mobile transceivers comprising embodiments of the transceiver 100 of FIG. 1. Furthermore, some embodiments relate to base station transceivers comprising embodiments of the transceiver 100 of FIG. 1. Moreover, some embodiments relate to a mobile communication system comprising at least one mobile transceiver and at least one base station transceiver. Within the mobile communication system, at least one of the mobile transceiver and the base station transceiver may comprise embodiments of the transceiver 100 of FIG. 1.

The mobile communication system may, for example, correspond to one of the Third Generation Partnership Project (3GPP)-standardized mobile communication networks, where the term mobile communication system is used synonymously to mobile communication network. The mobile or wireless communication system may correspond to a mobile communication system of the 5th Generation (5G) and may use mm-Wave technology. The mobile communication system may correspond to or comprise, for example, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN), or mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

A base station transceiver can be operable to communicate with one or more active mobile transceivers and a base station transceiver can be located in or adjacent to a coverage area of another base station transceiver, e.g. a macro cell base station transceiver or small cell base station transceiver. Hence, embodiments may provide a mobile communication system comprising one or more mobile transceivers and one or more base station transceivers, wherein the base station transceivers may establish macro cells or small cells, as e.g. pico-, metro-, or femto cells. A mobile transceiver may correspond to a smartphone, a cell phone, user equipment, a laptop, a notebook, a personal computer, a Personal Digital Assistant (PDA), a Universal Serial Bus (USB)-stick, a car, etc. A mobile transceiver may also be referred to as User Equipment (UE) or mobile in line with the 3GPP terminology.

A base station transceiver can be located in the fixed or stationary part of the network or system. A base station transceiver may correspond to a remote radio head, a transmission point, an access point, a macro cell, a small cell, a micro cell, a femto cell, a metro cell etc. A base station transceiver can be a wireless interface of a wired network, which enables transmission of radio signals to a UE or mobile transceiver. Such a radio signal may comply with radio signals as, for example, standardized by 3GPP or, generally, in line with one or more of the above listed systems. Thus, a base station transceiver may correspond to a NodeB, an eNodeB, a Base Transceiver Station (BTS), an access point, a remote radio head, a relay station, a transmission point etc., which may be further subdivided in a remote unit and a central unit.

A mobile transceiver can be associated with a base station transceiver or cell. The term cell refers to a coverage area of radio services provided by a base station transceiver, e.g. a NodeB (NB), an eNodeB (eNB), a remote radio head, a transmission point, etc. A base station transceiver may operate one or more cells on one or more frequency layers, in some embodiments a cell may correspond to a sector. For example, sectors can be achieved using sector antennas, which provide a characteristic for covering an angular section around a remote unit or base station transceiver. In some embodiments, a base station transceiver may, for example, operate three or six cells covering sectors of 120° (in case of three cells), 60° (in case of six cells) respectively. A base station transceiver may operate multiple sectorized antennas. In the following a cell may represent an according base station transceiver generating the cell or, likewise, a base station transceiver may represent a cell the base station transceiver generates.

In other words, in embodiments the mobile communication system may correspond to a HetNet, which utilizes different cell types, i.e. Closed Subscriber Group (CSG) cells and open cells, and cells of different sizes, as, for example, macro cells and small cells, where the coverage area of a small cell is smaller than the coverage area of a macro cell. A small cell may correspond to a metro cell, a micro cell, a pico cell, a femto cell, etc. Such cells are established by base station transceivers for which their coverage areas are determined by their transmission power and interference condition. In some embodiments a small cell's coverage area can at least partly be surrounded by the coverage area of a macro cell established by another base station transceiver. The small cells can be deployed to extend the capacity of the network. A metro cell may therefore be used to cover a smaller area than a macro cell, e.g. a metro cell may cover a street or a section in a metropolitan area. For a macro cell the coverage area may have a diameter in the order of one or more kilometers, for a micro cell the coverage area may have a diameter below a kilometer, and for a pico cell the coverage area may have a diameter below a 100 m. A femto cell may be the smallest cell and it may be used to cover a household or gate section at the airport, i.e. its coverage area may have a diameter below 50 m. Thus, a base station transceiver may also be referred to as cell.

Figure 2A:
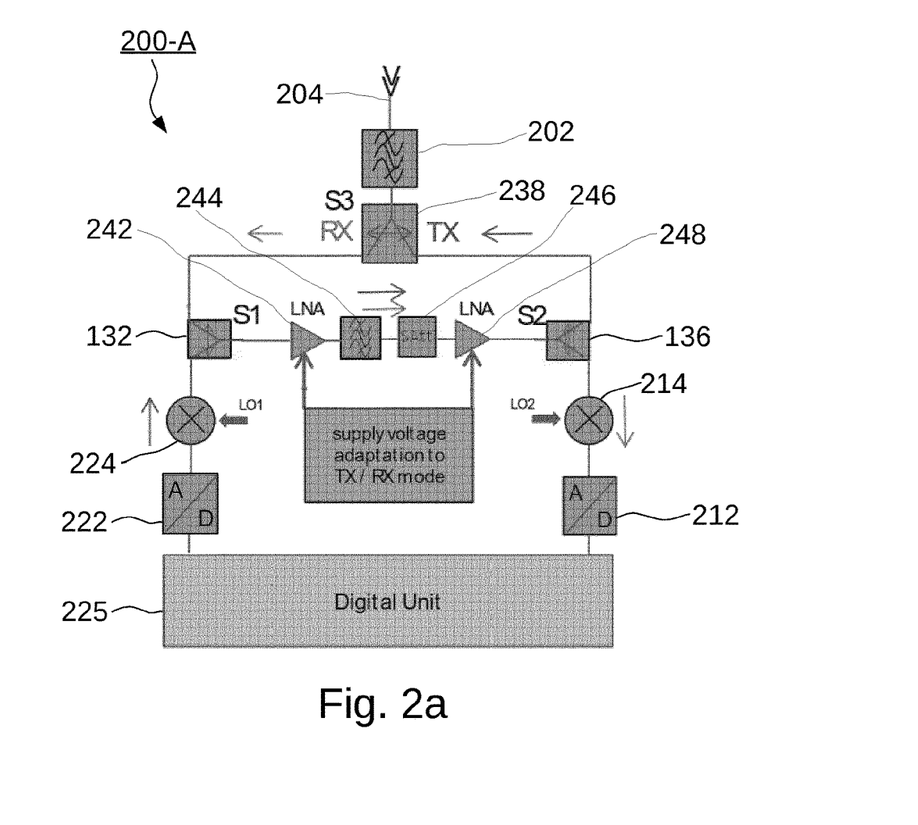
FIG. 2a shows a schematic block diagram of a transceiver comprising an amplifier composed of a first and a second amplifier stage with an adjustable attenuator and a bandpass filter coupled between the first and the second amplifier stage.

FIG. 2a shows a schematic block diagram of a transceiver 200-A comprising an amplifier with a first amplifier stage 242 and a second amplifier stage 248 and an adjustable attenuator 246 and a bandpass filter 244. The adjustable attenuator 246 and the bandpass filter 244 are coupled between the first and the second amplifier stage 242, 248.

In the exemplary transceiver 200-A, the first and the second amplifier stage 242, 248 are designed as low noise amplifiers, e.g., amplifiers optimized rather for a low noise figure than for high power-added efficiency. These low noise amplifiers can be designed to or may be chosen from available amplifiers to comprise a maximum radio frequency (RF) output power sufficient for providing a desired transmit output power of the transceiver 200-A (as well as a for providing a desired receive output power).

In other words, FIG. 2a shows an analog RF concept of a transceiver 200-A that operates according to a time division duplex operation mode. In the transceiver 200-A, a line-up (e.g., a series connection of analog signal processing devices) comprises a step attenuator 246 (e.g., an adjustable attenuator), one or several low noise amplifier(s) (e.g., the first amplifier stage 242 and the second amplifier stage 248) and an RF filter 244 (e.g., a surface-acoustic-wave filter) for receive operation and/or transmit operation. This line-up can be commonly used during a receive and a transmit operating mode of the transceiver 200-A. The common use of this line-up can be achieved by implementation and use of the two switches S1 and S2 (e.g., the first switch 132 and the second switch 136).

In the transceiver 200-A, a common terminal of the first switch 132 is coupled to the input-port of the first amplifier stage 242, a first throw terminal of the first switch 132 is coupled to a first throw terminal of an antenna switch 238 of the transceiver 200-A, and a second throw terminal of the first switch 132 is coupled to an output-port of an upconversion mixer 224 of a transmit signal path of the transceiver 200-A. Moreover, a common terminal of the second switch 136 is coupled to the output-port of the second amplifier stage 248, a first throw terminal of the second switch 136 is coupled to an input-port of a downconversion mixer 214 of a receive signal path of the transceiver 200-A, and a second throw terminal of the second switch 136 is coupled to a second throw terminal of the antenna switch 238.

The first and the second switch 132, 136 are controlled in that way, that in case of transmit operation (e.g., during the transmit operating mode), the low noise amplifier inputs (e.g., the input-port of the first amplifier stage 242) are connected via the first switch 132 to the upconversion output (e.g., the output-port of the upconversion mixer 224). Furthermore, during transmit operation, the outputs of the low noise amplifiers (e.g., the output-port of the second amplifier stage 248) are connected via the second switch 136 to the antenna switch 238. The antenna switch 238 can feed a signal to be transmitted (e.g., an analog transmit signal of the transceiver 200-A) to an antenna 204 (e.g., a transceive antenna) of the transceiver 200-A.

In the example of the transceiver 200-A, the antenna switch 238 is a single-pole double-throw switch with its common terminal coupled to the antenna 204. During the transmit operating mode, a contact between the common terminal and the second throw terminal of the antenna switch can be closed. The antenna switch 238 as well as the first and the second switch 132, 136 can be actuated by control circuitry (e.g., a controller circuit) of the transceiver 200-A. Moreover, an input-output bandpass filter 202 (e.g., a common transmit and receive bandpass filter) is coupled between the antenna switch 238 and the antenna 204.

In case of receive operation (e.g., during the receive operating mode), the input of the low noise amplifiers (e.g., the input-port of the first amplifier stage 242) is connected via the first switch 132 and the antenna switch 238 to the antenna 204. Furthermore, the low noise amplifiers outputs (e.g., the output-port of the second amplifier stage 248) are connected via the second switch 136 to the downconverter's input (e.g., to the input-port of the downconversion mixer 214).

An output-port of the downconversion mixer 214 is coupled to a sampling input-port of an analog-to-digital converter 212 of the receive signal path. A digital output-port of the analog-to-digital converter 212 is coupled to an input-port of a digital unit 225 of the transceiver 200-A. The digital unit 225 can comprise at least a part of a digital signal processor (DSP), a part of an application specific integrated circuit (ASIC), and/or a part of a central computing unit (CPU), for example. The digital unit 225 may perform further signal processing (e.g., demodulation, detection, and/or decoding) of a receive signal of the transceiver 200-A. Moreover, the digital unit 225 can comprise control circuitry for actuating the first and the second switch 132, 136. Additionally, or alternatively, the digital unit 225 can be configured to adjust a supply voltage of the first and/or the second amplifier stage 242, 248. To this end, the digital unit 225 can comprise input-ports and output-ports (I/Os) coupled to control input-ports of the first and the second switch 132, 136 and/or coupled to control input-ports of a tunable voltage converter (e.g., a tunable direct-current-to-direct-current converter) or of a supply-modulator, which can provide the supply voltage to the first and/or the second amplifier stage 242, 248.

Furthermore, the digital unit 225 can be configured to generate a digital transmit signal of the transceiver 200-A. A digital-to-analog converter 222 coupled to an output-port of the digital unit 225 can transform the digital transmit signal to the analog transmit signal. An input-port of the upconversion mixer 224 is coupled to an analog output-port of the digital-to-analog converter 222, so that the upconversion mixer 224 can convert the analog transmit signal to a radio frequency for transmission via the antenna 204.

In this embodiment, the bandpass filter 244 (or RF filter 244) is placed in between the low noise amplifiers (e.g., in between the first and the second amplifier stage 242, 248). The input-port of the filter 244 is coupled to the output-port of the first amplifier stage 242, and the output-port of the filter 244 is coupled to the input-port of the adjustable attenuator 246. The output-port of the adjustable attenuator 246 is coupled to the input-port of the second amplifier stage 248.

Coupling the filter 244 between the first and the second amplifier stage 242, 248 can reduce the noise figure (e.g., the noise figure of the receive signal path) and may additionally reduce out-of-band-blockers (e.g., interfering signals outside the frequency band of the wanted receive and/or wanted transmit signal) in case of receive operation. In other words, by coupling the filter 244 between the first and the second amplifier stage 242, 248, the insertion loss of the filter 244 does not directly contribute to the noise figure of the receive signal path. Furthermore, a compensation of the insertion loss of the filter 244 by the second amplifier stage 248 can be avoided.

Because the low noise amplifiers (e.g., the first and the second amplifier stage 242, 248) can also be used as transmit power amplifiers, the transceiver 200-A can be employed in applications like massive multiple-input multiple-output (MMIMO) and/or in multichannel transceiver systems, due to less required power per transmit path/amplifier. Depending on the application, the number of transmit paths in a MMIMO system, etc., the desired transmit power can exceed the desired power (e.g. ensuring linearity) of the receive signal path. In such cases, the low noise amplifiers (e.g., the first and the second amplifier stage 242, 248) can be dimensioned with respect to the transmit power requirements. During receive operation a supply voltage of the low noise amplifiers can be adapted (e.g., reduced) in order to save energy efficiency (e.g., to reduce the power consumption of the transceiver 200-A). This can be achieved by an adaptive power supply. For example, Gallium-Nitride based low noise amplifiers could provide higher power if desired.

The proposed attenuator-amplifier-filter-line-up can be combined with different up- and/or down-conversion concepts like direct-up/down or heterodyning. Since the proposed concept may be applied to the analog RF amplification and filtering part, it can also be combined with integrated transceiver conversion solutions. For example, the digital unit 225, the digital-to-analog converter 222, the analog-to-digital converter 212, the upconversion mixer 224, and the downconversion mixer 214 can be integrated into a common semiconductor die or into a common semiconductor package. Furthermore, the first and the second switch 132, 136 can be additionally integrated into this common semiconductor die or common semiconductor package.

The attenuator-amplifier-filter-line-up can also be realized as a compact hybrid or integrated solution, for example, an integrated solution which at least comprise some functions. If the low noise amplifiers (e.g., the first and the second amplifier stage 242, 248) are wideband capable and the filter 244 can be exchanged and substituted by another one with same foot print but different frequency band, the line-up can be reused for different frequency bands.

Figure 2B:
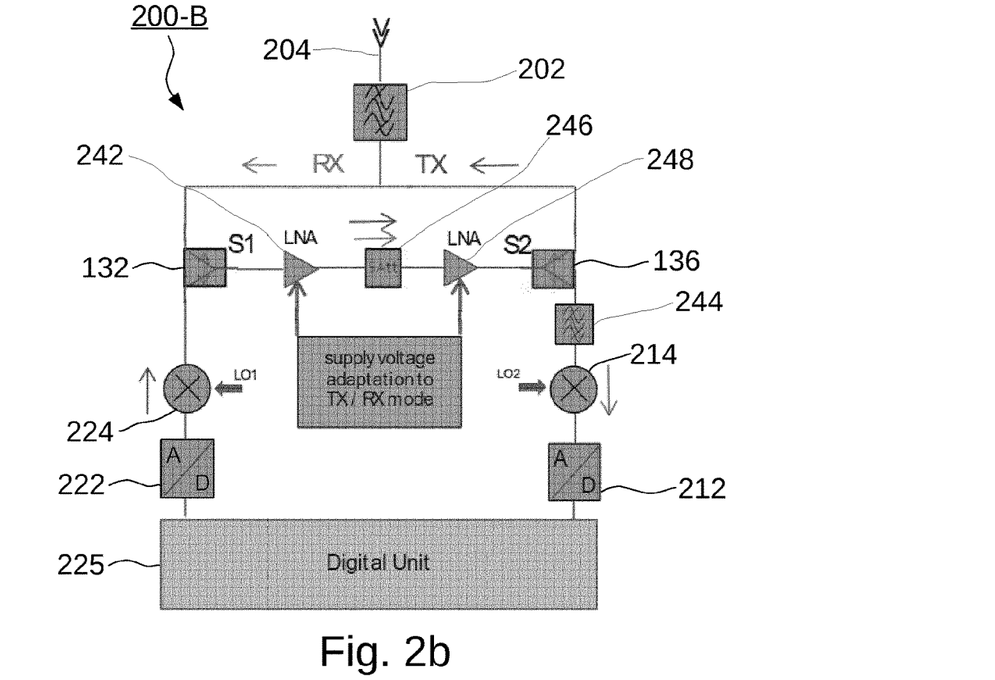
FIG. 2b shows a schematic block diagram of a transceiver comprising an amplifier with a first and a second amplifier stage and an adjustable attenuator coupled between the first and the second amplifier stage and comprising a bandpass filter coupled in a receive signal path of the transceiver.

FIG. 2b shows a schematic block diagram of a transceiver 200-B comprising an amplifier with a first amplifier stage 242 and a second amplifier stage 248 and an adjustable attenuator 246.

An output-port of the first amplifier stage 242 is coupled to an input-port of the adjustable attenuator 246. An output-port of the adjustable attenuator 246 is coupled to an input-port of the second amplifier stage 248. For example, the transceiver 200-B can transmit and receive according to time division duplexing. In contrast to the transceiver 200-A of FIG. 2a, an RF filter 244 (e.g., an RF receive filter 244) of the transceiver 200-B is not coupled in the signal processing chain common for the receive and the transmit signal path of the transceiver 200-B (e.g., between the first and the second switch 132, 136), but is coupled between the second switch 136 and an input-port of a downconversion mixer 214 of the receive signal path. This can further reduce the noise figure of the receive signal path, and/or enhance the maximum transmit output power at an antenna 204 of the transceiver 200-B, and/or increase the power-added efficiency of the transceiver 200-B during transmitting.

Compared to the transceiver 200-A of FIG. 2a, in the transceiver 200-B an antenna switch is omitted, because the first switch 132 and the second switch 136 can care for transmit-receive separation by themselves. This can lead to additional reduced (hardware) complexity of the transceiver 200-B. However, for increasing the transmit-to-receive isolation (and/or the receive-to-transmit isolation), an additional antenna switch like the antenna switch of transceiver 200-A may be provided and may be coupled between the first and the second switch 132, 136 and the antenna 204.

More details and aspects are mentioned in connection with the embodiments described above or below. The examples shown in FIGS. 2a and 2b may comprise one or more optional additional features corresponding to one or more aspects mentioned in connection with the proposed concept or one or more examples described above (e.g. FIG. 1) or below (e.g. FIGS. 3a-5).

Figure 3A:
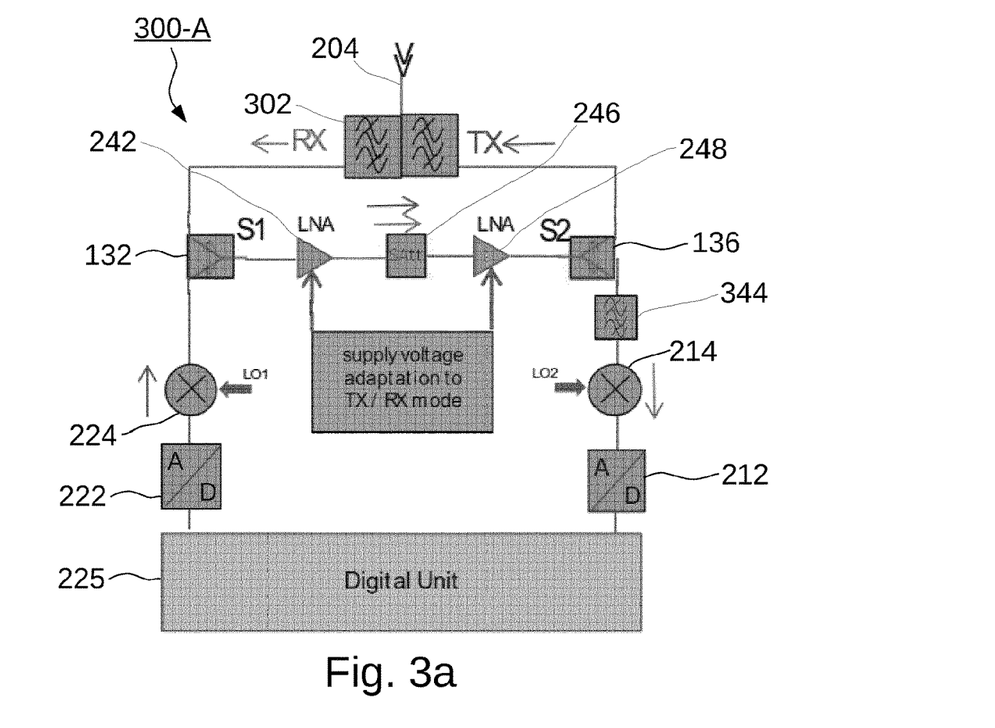
FIG. 3a shows a schematic block diagram of a transceiver comprising a diplexer coupled to a transceive antenna of the transceiver.

FIG. 3a shows a schematic block diagram of a transceiver 300-A comprising an amplifier with a first amplifier stage 242 and a second amplifier stage 248 and an adjustable attenuator 246 coupled between the first and the second amplifier stage 242, 248.

The transceiver 300-A can be employed for a time division based, simplified frequency division duplexing (FDD) operation. In time division based, simplified FDD operation, the transceiver 300-A may transmit and receive during different time slots and may transmit and receive at different carrier frequencies. Time division based, simplified FDD operation can, for example, be employed for Internet-of-Things (IoT) applications. To this end in the exemplary transceiver 300-A, an RF filter 344 (e.g., an RF receive filter 344) is not coupled in the signal processing chain common for the receive and the transmit signal path of the transceiver 300-A (e.g., between the first and the second switch 132, 136), but can be placed after the second switch 136 in the receive signal path. In the exemplary transceiver 300-A, the RF receive filter 344 is coupled between the second switch 136 and an input-port of a downconversion mixer 214 of the receive signal path. The RF receive filter 344 can then comprise a passband matching the frequency band of receive signals of the transceiver 300-A only and may suppress transmit signals of the transceiver 300-A. The resulting attenuator-amplifier-line-up (coupled between the first and the second switch 132, 136) can support FDD if designed to cover the receive band as well as the transmit band. For example, the bandwidth of the first and the second amplifier stage 242, 248 as well as the bandwidth of the adjustable attenuator 246 may at least extend over the frequency band of the transmit signals and the frequency band of the receive signals of the transceiver 300-A.

Compared to the transceivers 200-A, 200-B of FIGS. 2a and 2b, the input-output bandpass filter 202 is replaced by a diplexer 302. A first port of the diplexer 302 is coupled to an antenna 204 (e.g., a transceive antenna) of the transceiver 300-A. A second port of the diplexer 302 is coupled to the first switch 132 of the transceiver 300-A. A third port of the diplexer 302 is coupled to the second switch 136 of the transceiver 300-A. The diplexer 302 may pass receive signals of the transceiver 300-A from its first port to its second port and may suppress signals outside the frequency band of the receive signals from traveling from its first port to its second port. Moreover, the diplexer 302 may pass transmit signals of the transceiver 300-A from its third port to its first port and may suppress signals outside the frequency band of the transmit signals from traveling from its third port to its first port. In other words, the diplexer 302 can be configured to separate receive and transmit signals of the transceiver 300-A according to their frequency bands.

Figure 3B:
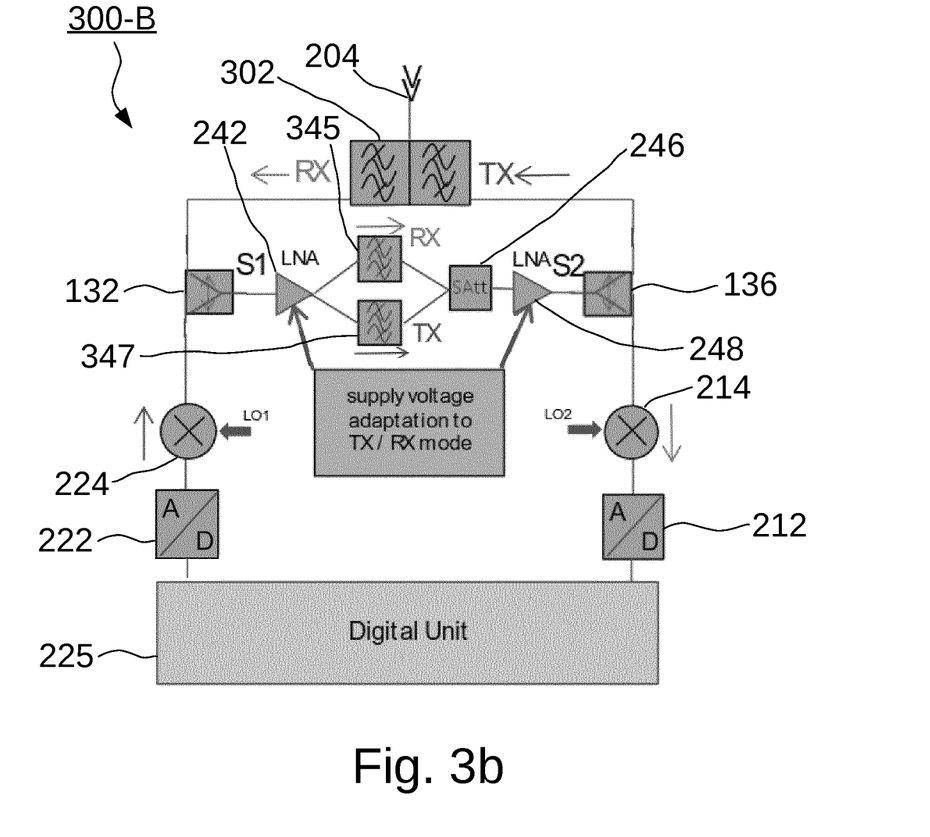
FIG. 3b shows a schematic block diagram of a transceiver comprising a dual band filter coupled between a first and a second amplifier stage of an amplifier of the transceiver.

If, for example, a filter in between the low-noise-amplifier stages (e.g., between the first amplifier stage 242 and the second amplifier stage 248) is desired in order to protect in case of time multiplexed FDD operation the second low-noise-amplifier (e.g., the second amplifier stage 248) from being overdriven (linearity) (e.g., during a receive operating mode of the transceiver 300-A), a dual band filter can be used as indicated by the exemplarily embodiment of transceiver 300-B shown schematically in FIG. 3b.

In the transceiver 300-B, a dual band filter is coupled between an output-port of a first amplifier stage 242 of the transceiver 300-B and an input-port of an adjustable attenuator 246 of the transceiver 300-B. Alternatively, the dual band filter can be coupled between the adjustable attenuator 246 and a second amplifier stage 248 of the transceiver 300-B. The dual band filter comprises a first bandpass filter 345 and a second bandpass filter 347. The first and the second bandpass filters 345, 347 are connected in parallel. The first bandpass filter 345 can comprise a passband covering the frequency band of receive signals of the transceiver 300-B. The second bandpass filter 347 can comprise a passband covering the frequency band of transmit signals of the transceiver 300-B.

Alternatively to a diplexer 302 and/or an antenna switch, a directional coupler can be used to separate the transmit and the receive band after the antenna 204 to the filters.

More details and aspects are mentioned in connection with the embodiments described above or below. The examples shown in FIGS. 3a and 3b may comprise one or more optional additional features corresponding to one or more aspects mentioned in connection with the proposed concept or one or more examples described above (e.g. FIGS. 1 to 2b) or below (e.g. FIGS. 4-5).

Figure 4:
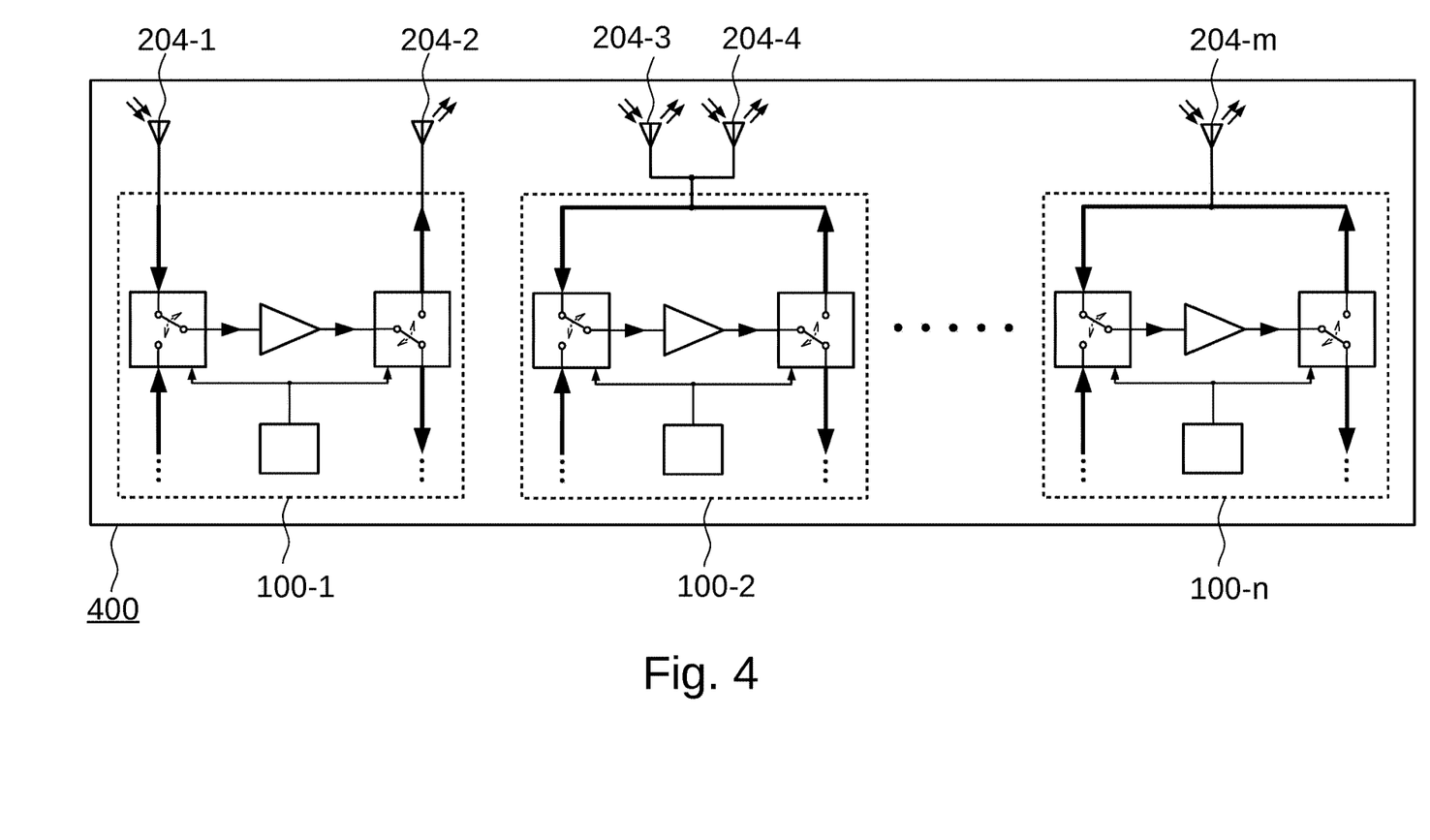
FIG. 4 shows a schematic block diagram of a transceiver system.

FIG. 4 shows a schematic block diagram of a transceiver system 400. The transceiver system 400 comprises a plurality of antennas 204-1, 204-2, 204-3, 204-4, 204-$m$, and a plurality of transceivers 100-1, 100-2, 100-$n$. Each transceiver of the plurality of transceivers is coupled to at least one antenna of the plurality of antennas. Furthermore, each transceiver comprises a transmit signal path, a receive signal path, an amplifier, and control circuitry. The control circuitry of each transceiver (and/or a central control circuitry of the transceiver system serving the transceivers of the plurality of transceivers) is configured to couple the amplifier of each transceiver in the transmit signal path of each transceiver to amplify a transmit signal during a transmit operating mode of each transceiver. Furthermore, the control circuitry of each transceiver (and/or a central control circuitry of the transceiver system) is configured to couple the amplifier of each transceiver in the receive signal path of each transceiver to amplify a receive signal during a receive operating mode of each transceiver.

For example, each transceiver of the plurality of transceivers may be similar to the transceiver 100 of FIG. 1, to the transceiver 200-A of FIG. 2a, to the transceiver 200-B of FIG. 2b, to the transceiver 300-A of FIG. 3a, and/or to the transceiver 300-B of FIG. 3b.

Alternatively to each transceiver comprising (separate) control circuitry, the transceiver system 400 can comprise central control circuitry for controlling at least some (or all) transceivers (e.g., for setting at least some transceivers into their receive operating mode by coupling their amplifiers into their receive signal paths and for setting these transceivers into their transmit operating mode by coupling their amplifiers into their transmit signal paths). The central control circuitry and/or the (separate) control circuitry of each transceiver can be configured to synchronize the receive operating modes and the transmit operating modes of at least two transceivers (e.g., to couple the amplifiers of at least two transceivers into their receive signal paths at a time and to couple the amplifiers into their transmit signal paths at another time). For example, if the transceiver system 400 operates according to time division duplexing, the central control circuitry and/or the (separate) control circuitry of each transceiver can be configured to synchronously set all transceivers to the receive operating mode (e.g., to synchronously couple each amplifier of each transceiver into its receive signal path) and to synchronously set all transceivers to the transmit operating mode (e.g., to synchronously couple each amplifier of each transceiver into its transmit signal path). The central control circuitry and/or the (separate) control circuitry of each transceiver can also be configured to set some transceivers to their receive operating mode and some transceivers to their transmit operating mode at the same time.

In the exemplary transceiver system 400, the plurality of transceivers comprises a generic number of n transceivers (e.g., n≥2). The plurality of antennas of the transceiver system 400 comprises a generic number of m antennas (e.g., m≥2). A transceiver of the plurality of transceivers can be coupled to one or more antennas of the plurality of antennas. For a transceiver operating, for instance, according to time division based, simplified frequency division duplexing a first subset of the plurality of antennas may be configured as receive antennas to receive receive signals within a receive frequency band and a second subset of the plurality of antennas may be configured as transmit antennas to transmit transmit signals within a transmit frequency band. The receive frequency band and the transmit frequency band may comprise different frequencies (e.g., different center frequencies and/or different bandwidths).

Without loss of generality, in the exemplary transceiver system 400 a receive signal path of a first transceiver 100-1 of the transceiver system 400 is coupled to first antenna 204-1 (e.g., a receive antenna) and a transmit signal path of the first transceiver 100-1 is coupled to a second antenna 204-2 (e.g., a transmit antenna). In case of a transceiver system 400 operating optionally according to time division based, simplified frequency division duplexing, the first antenna 204-1 may be configured to operate within a receive frequency band and the second antenna 204-2 may be configured to operate in a transmit frequency band. As an alternative, a single transceive antenna, whose bandwidth can cover the receive and the transmit frequency band, may replace the first and the second antenna 204-1, 204-2.

A receive and a transmit signal path of a second transceiver 100-2 of the transceiver system 400 are commonly coupled to third antenna 204-3 and a fourth antenna 204-4 (e.g., to two transceive antennas). For instance, the third antenna 204-3 and the fourth antenna 204-4 may be coupled via a power splitter (or a power combiner, or a directional coupler, or a switch) to a common terminal of an antenna switch of the second transceiver 100-2, while a first throw terminal of the antenna switch may be coupled to the receive signal path and a second throw terminal of the antenna switch may be coupled to the transmit signal path of the second transceiver 100-2. Again, in case of a transceiver system 400 operating optionally according to time division based, simplified frequency division duplexing, the third antenna 204-3 may be configured to operate within a receive frequency band and the fourth antenna 204-4 may be configured to operate in a transmit frequency band. As an alternative, another single transceive antenna, whose bandwidth can cover the receive and the transmit frequency band, may replace the third and the fourth antenna 204-3, 204-4.

A receive and a transmit signal path of an n-th transceiver 100-n of the transceiver system 400 are coupled to an m-th antenna 204-m (e.g., to a transceive antenna).

Of course, in some embodiments, each transceiver of the plurality of transceivers may be coupled to the same number of antennas (e.g., to the same number of transmit antennas, receive antennas, and/or transceive antennas).

Other transceiver systems comprising a plurality of transceivers with each transceiver comprising a dedicated amplifier in a receive signal path (e.g., a dedicated low noise amplifier) and a dedicated amplifier in a transmit signal path (e.g., a dedicated power amplifier) may consume a higher amount of power due to an increased number of amplifiers of each transceiver.

According to at least some embodiments of the present disclosure, by sharing an amplifier within each transceiver of the transceiver system 400 between the transmit signal path and the receive signal path of the transceiver (e.g., by using a common amplifier as a power amplifier during transmitting and as a low noise amplifier during receiving), an overall power consumption of the transceiver system 400 can be reduced.

In some embodiments of transceiver systems of the present disclosure, the antennas of the plurality of antennas may be in close proximity to each other (e.g., if the transceiver system 400 is employed for digital beamforming and/or within a phased antenna array). For example, the antennas may be spaced by half a wavelength or less of the transmit and/or receive RF signal. Due to the reduced number of amplifiers of each transceiver of the plurality of transceivers, an overall size of each transceiver may be reduced, so that space requirements for arranging transceivers at closely spaced antennas may be relaxed (e.g., less stringent) in the transceiver system 400.

For example, the transceiver system 400 may be employed in massive multiple-input multiple-output (MMIMO) systems. MMIMO may be a promising technology in order to face e.g. future demand on data rate and coverage. It can be used as access technology but also for providing wireless fronthaul connection to e.g. distributed relays. Putting together a large quantity of transceivers of embodiments of the present disclosure to a MMIMO system can avoid complex and costly systems with high energy consumption (or reduce complexity, costs and energy consumption of the MMIMO system). That is to say, the present disclosure addresses these issues by a providing an analog RF transceiver concept, which can reduce complexity and costs. Furthermore, transceiver solutions according to embodiments of the present disclosure may be used in Internet-of-Things (IoT/MTC) type of applications where low cost and low power consumption are often desired.

More details and aspects are mentioned in connection with the embodiments described above or below. The example shown in FIG. 4 may comprise one or more optional additional features corresponding to one or more aspects mentioned in connection with the proposed concept or one or more examples described above (e.g. FIGS. 1 to 3*b*) or below (e.g. FIG. 5).

Figure 5:
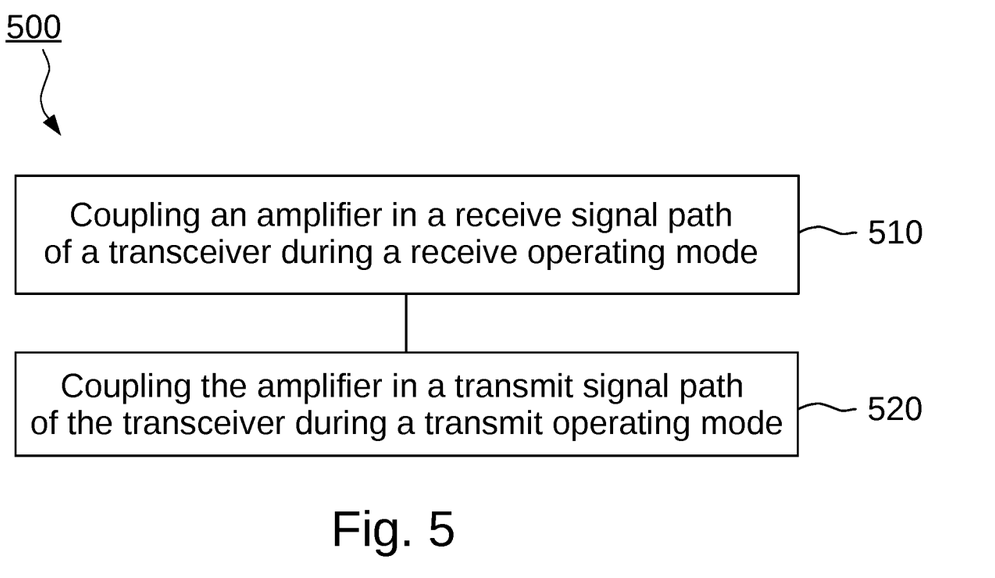
FIG. 5 shows a flow chart of a method for operating a transceiver.

FIG. 5 shows a flow chart of a method 500 for operating a transceiver. The method 500 comprises coupling 510 an amplifier in a receive signal path of the transceiver to amplify a receive signal during a receive operating mode of the transceiver. Furthermore, the method 500 comprises coupling 520 the amplifier in a transmit signal path of the transceiver to amplify a transmit signal during a transmit operating mode of the transceiver.

For example, the method 500 can be employed for operating a transceiver according to time division duplexing or time division based, simplified frequency division duplexing. Coupling 510 the amplifier in the receive signal path during the receive operating mode and coupling 520 the amplifier in the transmit signal path during the transmit operating mode can reduce the manufacturing costs of the transceiver, the overall size of the transceiver 100, and/or can reduce the power consumption of the transceiver as less amplifiers may be supplied with electric power.

Of course, the steps of the method 500 may be reversed and/or repeated. That is, at first the transceiver can be in the transmit operating mode and the amplifier can be coupled into the transmit signal path and be used for amplifying the transmit signal. After the transmit operating mode, the transceiver can switch (or switch back) to the receive operating mode and couple the amplifier into the receive signal path to amplify the receive signal.

According to some examples, the method 500 further comprises decreasing a supply voltage of the amplifier during the receive operating mode and increasing the supply voltage of the amplifier during the transmit operating mode. This can further decrease an average power consumption of the transceiver.

More details and aspects are mentioned in connection with the embodiments described above or below. The example shown in FIG. 5 may comprise one or more optional additional features corresponding to one or more aspects mentioned in connection with the proposed concept or one or more examples described above (e.g. FIGS. 1 to 4) or below.

Some embodiments relate to a compact analog radio frequency transceive concept for time division duplexing massive multiple-input multiple-output (massive MIMO) and Internet-of-Things applications.

At least some examples of the present disclosure are related to an analog RF transceiver for TDD based Massive MIMO applications and/or a time division based, simplified FDD (or also TDD) operation as a possible employment for IoT-devices. Since for TDD the same frequency band can be used for receiving as well as for transmitting, but in a time multiplexed manner, a common RF attenuator-low noise amplifier-filter line-up can be used for receiving as well as for transmitting. This can include an appropriate implementation of switches. Thus, only one RF amplification and filtering path may be designed (for the analog RF transceiver) and a power amplifier as well as an additional step attenuator and the related design effort can be saved.

During transmit operation, the low noise amplifier(s) of the common RF attenuator-low noise amplifier-filter line-up can be used as transmit power amplifiers. To this end, the low noise amplifier(s) can be chosen with respect to a desired transmit power level, which can be (depending e.g. on number of elements of a MMIMO system) higher than what may be desired for receive operation. Additionally, if output power of the low noise amplifier(s) during the transmit operating mode is higher than for the receive operating mode, the power supply voltage of the low noise amplifier(s) can be adapted (e.g., reduced) during receive operation, in order to save energy. Moreover, a transceiver according to the present disclosure may be used in IoT-devices, in which low cost low power reduced transmission power amplifiers are often desired.

Other transceivers to address topics such as hardware complexity, manufacturing costs, and/or power consumption, relate to hybrid MMIMO, for example, which can mean that e.g. one transceiver may serve several transmit and receive antennas and either fixed or adaptive analog phase shifters can be used (e.g., for feeding the transmit and receive antennas). This can reduce the number of conversion modules (e.g., the number of digital-to-analog converters, analog-to-digital converters, and/or up- and downconverters) of a transceiver. While this may reduce an effort on the conversion, there may be a trade-off on performance. Furthermore, integrated transceiver solutions, comprising several transmit and receive signal paths in one package can be used in order to reduce the cost and complexity again for the conversion unit. Moreover, low cost low performance devices (for MMIMO and IoT), which just meet the requirements (e.g., specifications of the transceiver) can be used.

A person of skill in the art would readily recognize that steps of various above described methods can be performed by programmed computers. Herein, some embodiments are also intended to cover program storage devices, e.g., digital data storage media, which are machine or computer readable and encode machine-executable or computer-executable programs of instructions, wherein said instructions perform some or all of the steps of said above-described methods.

The program storage devices may be, e.g., digital memories, magnetic storage media such as a magnetic disks and magnetic tapes, hard drives, or optically readable digital data storage media. The embodiments are also intended to cover computers programmed to perform said steps of the above-described methods.

Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The functions of the various elements shown in the figures, including any functional blocks labeled as "processors", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Similarly, any switches shown in the FIGS. are conceptual only. Their function may be carried out through the operation of program logic, through dedicated logic, through the interaction of program control and dedicated logic, or even manually, the particular technique being selectable by the implementer as more specifically understood from the context.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

The invention claimed is:
1. A transceiver, comprising:
a transmit signal path;
a receive signal path;
an amplifier;
control circuitry configured to selectively couple the amplifier in the transmit signal path to amplify a transmit signal during a transmit operating mode of the transceiver and configured to selectively couple the amplifier in the receive signal path to amplify a receive signal during a receive operating mode of the transceiver; and
an adjustable attenuator,
wherein the control circuitry is configured to adjust a supply voltage of the amplifier depending on an operating mode of the transceiver,
wherein the control circuitry comprises a first switch and a second switch,
wherein the amplifier is coupled between the first and the second switches,
wherein the adjustable attenuator is coupled between the first and the second switches, and
wherein the control circuitry is configured to set attenuation of the adjustable attenuator depending on an operating mode of the transceiver.

2. The transceiver of claim 1, wherein the control circuitry is configured to couple the amplifier as a first amplifier in the receive signal path to amplify the receive signal at a radio frequency during the receive operating mode.

3. The transceiver of claim 1, wherein the control circuitry is configured to couple the amplifier as a last amplifier in the transmit signal path to amplify the transmit signal at a radio frequency during the transmit operating mode.

4. The transceiver of claim 1, wherein the control circuitry is configured to operate the amplifier as a low noise amplifier with a noise figure smaller than 5 dB at least during the receive operating mode.

5. The transceiver of claim 1, wherein the control circuitry is configured to operate the amplifier as a power amplifier with a power-added efficiency larger than 10% at least during the transmit operating mode.

6. The transceiver of claim 1, wherein the amplifier comprises a first amplifier stage and a second amplifier stage, wherein the adjustable attenuator is coupled between the first amplifier stage and the second amplifier stage.

7. The transceiver of claim 1, wherein wherein a common terminal of the first switch is coupled to an input-port of the amplifier, wherein a first throw terminal of the first switch is coupled to a receive input-port of the receive signal path, wherein a second throw terminal of the first switch is coupled to a digital-to-analog converter of the transmit signal-path, wherein a common terminal of the second switch is coupled to an output-port of the amplifier, wherein a first throw terminal of the second switch is coupled to an analog-to-digital converter of the receive signal-path, and wherein a second throw terminal of the second switch is coupled to a transmit output-port of the transmit signal-path.

8. The transceiver of claim 7, wherein an upconversion mixer is coupled between the digital-to-analog converter and the second throw terminal of the first switch, and wherein a downconversion mixer is coupled between the first throw terminal of the second switch and the analog-to-digital converter.

9. The transceiver of claim 1, further comprising a dual band filter coupled between the first switch and the second switch.

10. The transceiver of claim 1, wherein an input of the amplifier is coupled directly to the first switch and an output of the amplifier is coupled directly to the second switch.

11. A transceiver system comprising a plurality of antennas and a plurality of transceivers according to claim 1, wherein each transceiver of the plurality of transceivers is coupled to at least one antenna of the plurality of antennas.

12. A method for operating a transceiver, the method comprising:
selectively coupling an amplifier in a receive signal path of the transceiver to amplify a receive signal during a receive operating mode of the transceiver;
selectively coupling the amplifier in a transmit signal path of the transceiver to amplify a transmit signal during a transmit operating mode of the transceiver, wherein both selectively coupling the amplifier in the receive signal path and selectively coupling the amplifier in a transmit signal path use first and second switches and wherein the amplifier is coupled between the first and the second switches;
adjusting a supply voltage of the amplifier depending on an operating mode of the transceiver; and
setting attenuation of an adjustable attenuator depending on an operating mode of the transceiver, wherein the adjustable attenuator is coupled between the first and the second switches.

13. An apparatus, comprising:
one or more transceivers, a respective one of the one or more transceivers comprising:
a transmit signal path;
a receive signal path;
an amplifier;
control circuitry configured to selectively couple the amplifier in the transmit signal path to amplify a transmit signal during a transmit operating mode of the respective transceiver and configured to selectively couple the amplifier in the receive signal path to amplify a receive signal during a receive operating mode of the respective transceiver; and
an adjustable attenuator,
wherein the control circuitry is configured to adjust a supply voltage of the amplifier depending on an operating mode of the respective transceiver,
wherein the control circuitry comprises a first switch and a second switch,
wherein the amplifier is coupled between the first and the second switches,
wherein the adjustable attenuator is coupled between the first and the second switches, and
wherein the control circuitry is configured to set attenuation of the adjustable attenuator depending on an operating mode of the respective transceiver.

14. The apparatus of claim 13, wherein:
the one or more transceivers comprise a plurality of the respective transceivers; and
the apparatus comprises a plurality of antennas, wherein each respective transceiver of the plurality of transceivers is coupled to at least one antenna of the plurality of antennas.

15. The apparatus of claim 13, wherein, for the respective transceiver, an input of the amplifier is coupled directly to the first switch and an output of the amplifier is coupled directly to the second switch.

16. The apparatus of claim 13, wherein, for the respective transceiver, the control circuitry is configured to couple the amplifier as a first amplifier in the receive signal path to amplify the receive signal at a radio frequency during the receive operating mode.

17. The apparatus of claim 13, wherein, for the respective transceiver, the control circuitry is configured to couple the amplifier as a last amplifier in the transmit signal path to amplify the transmit signal at a radio frequency during the transmit operating mode.

18. The apparatus of claim 13, wherein, for the respective transceiver, the amplifier comprises a first amplifier stage and a second amplifier stage, wherein the adjustable attenuator is coupled between the first amplifier stage and the second amplifier stage.

19. The apparatus of claim 13, wherein, for the respective transceiver:

a common terminal of the first switch is coupled to an input-port of the amplifier, a first throw terminal of the first switch is coupled to a receive input-port of the receive signal path, a second throw terminal of the first switch is coupled to a digital-to-analog converter of the transmit signal-path, a common terminal of the second switch is coupled to an output-port of the amplifier, wherein a first throw terminal of the second switch is coupled to an analog-to-digital converter of the receive signal-path, and a second throw terminal of the second switch is coupled to a transmit output-port of the transmit signal-path.

20. The apparatus of claim 13, further comprising, for the respective transceiver, a dual band filter coupled between the first switch and the second switch.

* * * * *

UNITED STATES PATENT AND TRADEMARK OFFICE
CERTIFICATE OF CORRECTION

PATENT NO. : 10,819,383 B2
APPLICATION NO. : 16/344077
DATED : October 27, 2020
INVENTOR(S) : Andreas Wich and Dirk Wiegner Page 1 of 1

It is certified that error appears in the above-identified patent and that said Letters Patent is hereby corrected as shown below:

In the Claims

In Claim 7:
Column 19, Line 50, "wherein" should be deleted.

Signed and Sealed this
Fifteenth Day of December, 2020

Andrei Iancu
*Director of the United States Patent and Trademark Office*